(12) United States Patent
Tabib et al.

(10) Patent No.: US 11,283,275 B2
(45) Date of Patent: Mar. 22, 2022

(54) SMART UNINTERRUPTIBLE POWER SUPPLY AND METHOD

(71) Applicants: Isac Tabib, White Plains, NY (US); Mohammad Mehdi Daryadel, Sanford, FL (US)

(72) Inventors: Isac Tabib, White Plains, NY (US); Mohammad Mehdi Daryadel, Sanford, FL (US)

( * ) Notice: Subject to any disclaimer, the term of this patent is extended or adjusted under 35 U.S.C. 154(b) by 807 days.

(21) Appl. No.: 16/181,495

(22) Filed: Nov. 6, 2018

(65) Prior Publication Data

US 2019/0280508 A1 Sep. 12, 2019

Related U.S. Application Data

(60) Provisional application No. 62/639,847, filed on Mar. 7, 2018.

(51) Int. Cl.
| | |
|---|---|
| H02J 7/00 | (2006.01) |
| G08B 29/18 | (2006.01) |
| H02J 9/06 | (2006.01) |
| G01R 31/3842 | (2019.01) |
| G01R 31/388 | (2019.01) |
| H02J 3/14 | (2006.01) |
| H02J 3/00 | (2006.01) |

(52) U.S. Cl.
CPC ........ *H02J 7/0068* (2013.01); *G01R 31/388* (2019.01); *G01R 31/3842* (2019.01); *G08B 29/181* (2013.01); *H02J 3/14* (2013.01); *H02J 7/0034* (2013.01); *H02J 9/061* (2013.01); *H02J 3/001* (2020.01)

(58) Field of Classification Search
CPC .......... H02J 7/0068; H02J 3/14; H02J 7/0034; H02J 9/061; H02J 3/001; G01R 31/3842; G01R 31/388; G08B 29/181
See application file for complete search history.

(56) References Cited

U.S. PATENT DOCUMENTS

2013/0275783 A1 10/2013 Liu et al.

*Primary Examiner* — Robert L Deberadinis
(74) *Attorney, Agent, or Firm* — Forge IP, PLLC

(57) ABSTRACT

A power supply employs a dynamic charging system and method for charging a battery, as well as a load shedding system and method for conserving battery life in the event of a power failure. The dynamic charging system and method includes at least one step during which the battery is analyzed in real time to determine the actual voltage of the battery, and then determines a charging voltage based at least in part on the actual battery voltage plus a charge differential. The load shedding system and method determines that a power failure has occurred and that the power supply is operating power of a battery, determines that a first event has occurred, and in response thereto terminates battery power to a first subset of components and determines that a second event has occurred, and in response thereto, terminates battery power to a second subset of components.

24 Claims, 8 Drawing Sheets

FIG. 4

| ●●●●○ IDEA 📶 | 11:32 PM | ✱ 🔋 |
|---|---|---|
| ≡ | Output 1/2 Config | ○ ○ ○ |

Output 1 ⬤

Output 1 max current [ 0.6 ] Amps

Disconnect when battery   At 80% >

On DC-IN loss cut off output 1 ⬤

Cut off after [ 3 ] min [ 5 ] sec

Output 2 ⬤

Output 2 max current [ 1.2 ] Amps

Disconnect when battery   At 60% >

On DC-IN loss cut off output 2 ○

Cut off after [ ] min [ ] sec

Save

FIG. 5

SMART UNINTERRUPTIBLE POWER SUPPLY AND METHOD

FIELD OF THE INVENTION

The present invention relates generally to the field of individual entry or exit registers and more specifically relates to controlling and registering access of persons to restricted areas or devices.

BACKGROUND OF THE INVENTION

Smart uninterruptible power supplies are commonly used for many applications including access security as well as fire safety evacuation enablement. As sophistication grows in the form of advanced hardware and software, control of smart uninterruptible power supplies improves. To date, many improvements have been made including both wireless and wired communication control.

Existing smart uninterruptible power supplies power electronic door locks of 12V and 24V with voltage and current output capacity controlled by a regulator and current limit protection. Current limiting set points are load dependent. Excessive load current triggers a disconnect of the power to the load. This disconnect is often in the form of a dry relay or fuse that must be manually replaced. Other manual control functions include powering of fail-safe or fail-secure electric locks as well as dry contact signaling. Fail safe operation unlocks a door if power is lost. Fail secure keeps a door locked if power is lost. Dry contact signaling will trigger a relay that manages a load.

Smart uninterruptible power supplies are powered by batteries and/or voltage sources and function as a voltage conversion mechanism that creates the desired 12V and 24V AC or DC output voltages that in turn power loads such as electronic door locks. Versions of smart uninterruptible power supplies act as battery chargers and battery monitors. Systems exist for manual selection of output voltages, including manually activated potentiometer control and jumper settings.

Existing smart uninterruptible power supplies lack an automatic ability to restore power to the field device after a short circuit or overload condition has been corrected as they use standard fuses that must be manually replaced. In some instances, resettable relays are used; however, relay reliability is poor due to arcing that can cause contact resistance to increase or in some instances, welding the contacts together thus eliminating the ability to switch off power to the load. Existing smart uninterruptible power supply designs also lack the ability to predict load failures based on changes in load current levels or the ability to recover from reverse polarity issues. Existing smart uninterruptible power supply designs also lack meaningful visual interface displays. Existing smart uninterruptible power supplies offer onboard temperature and humidity sensing.

Various attempts have been made to solve problems found in the art of controlling and registering access of persons to restricted areas or devices. Among these are found in: U.S. Patent Publication No. 2013/0275783 to Liu, et. al., who disclosed a method of operation including receiving, by a power supply with battery backup, a battery test command from a user interface on a remote device, switching the power supply to the battery backup in response to the battery test command, monitoring voltage and discharge current of the battery, determining that the battery has reached a threshold capacity due the battery discharge, terminating the battery discharge test and switching the power supply off of the battery backup. The battery backup test command received may be a one-click selection input at a user interface on the remote device where the battery test command is sent to the power supply in response to the one-click selection input. An apparatus that performs the method of operation is also disclosed.

Security concerns are at an all-time high, thus requiring sophisticated solutions for smart uninterruptible power supplies. Monitoring of battery status and age along with power door lock load changes offers improved reliability and longer product lifespan, yet issues with reverse polarity remain. Menu driven setup and activation expands installation and programmability options for controlling access and managing loads, yet current designs have failed to keep pace with software Applications and secure wireless transmission capabilities. Advances in display technology and sensor technology offer enhanced setup and maintenance capabilities that have yet to find their way into smart uninterruptible power supplies. Local computational capability allows for immediate decision and control as well as providing arithmetic results and real-time status control during events such as Ethernet/WiFi outages or other loss of signal situations. Still, these functions do not offer real time diagnostics on location in existing smart uninterruptible power supplies.

Advances in wireless signaling enable Bluetooth and WiFi control, in addition to the native Ethernet wired connection to the controller yet systems lack the sophistication for onsite problem solving. Software Applications commonly known as "apps" expand control beyond dedicated instruments to phones, computers, and tablets in many devices in the security industry, yet power supplies lack this level of intelligence. Data comparison logic in current smart uninterruptible power supplies is limited to manufacturer specification data which often favors safety while overlooking extending battery life and charge distribution. There exists a need for local, real-time computational information, such as power consumed, voltages and currents along the power distribution path, and battery status, presence, polarity orientation, and health. Furthermore, intelligence needs to be added for localized system control, monitoring, reverse polarity sensing and recovery, and for predicting failures.

None of the above inventions and patents, taken either singly or in combination, is seen to describe the invention as claimed. Thus, a need exists for a reliable smart uninterruptible power supply, and to avoid the above-mentioned problems and incorporate the advantageous technology described herein.

SUMMARY OF THE INVENTION

The present invention advantageously fills the aforementioned deficiencies by providing a smart uninterruptible power supply and method. The smart uninterruptible power supply's main function is to provide regulated output voltages with load current control. The preferred embodiment is optimized for powering electronic controllers and electric locks on security doors and signaling loads such as fire alarms, as well as powering alarms, relays, lights, cameras, motion detectors, temperature detectors, gate controllers, and PLC controllers. The 12V and 24V operating voltage levels enable use in automotive and military applications where controlled power and reverse polarity issues can be recovered from with ease. The smart uninterruptible power supply can also be powered by, as well as charge, a single battery as a 12V power source or two series 12V batteries as a 24V power source via a battery bidirectional power source input/battery charging output connector. This connection is also a means for charging the battery(s).

The present invention is superior to other systems in that it effectively is configured with features that enhance installation setup requirements and minimize installation duration; increase functionality and versatility especially on location; include local diagnostic computation and data display; extends communication capability to WiFi and Bluetooth; offers extended control to electronic controllers and electric door locks; monitors battery and load conditions with the ability to signal and enact protective action; automatically recovers from faults such as shorted loads and overcurrent loading, and input battery and load polarity reversal; predicts load component failures; and alerts a user via email, website, alarm, or display. Collectively, these enhancements and features provide for easy remote maintenance and monitoring, away from the installation site, thus minimizing ongoing support costs while providing for shorter response times. For example, remote and automatic reinstatement of power by digitally controlled circuit breakers eliminates the need for a technician to make a service call just to replace a fuse or relay that has failed due to contact stresses.

The disclosure provides a smart uninterruptible power supply and method of use for enhancing output voltage regulation levels through programmable control and monitoring, battery life, reliability, and installation while providing alerts for detected fault occurrences.

The smart uninterruptible power supply includes a programmable controller having a first algorithm; an LCD display having displayed information including, information regarding power supply status and operating levels, warnings and alerts, a WLAN IP address, an ethernet address, a gateway address, and programmable text and logos; a sensor for touchless gesture control to change screens on the LCD display; onboard temperature sensing capability; onboard humidity sensing capability; four programmable/supervised input controls; and four "wet" voltage programmable outputs, each having, a digitally controlled and automatically resettable solid-state circuit breaker including load current monitoring and reporting capability. Each of the four "wet" DC outputs are programmable for voltage and current levels in pairs of two outputs per regulator. Two of the outputs are subservient to a first regulator and two of the outputs are subservient to a second regulator. The smart uninterruptible power supply also includes an RS-485 communication port; an Ethernet RJ-45 connector; a USB 5V power port; an onboard DIP switch including, a plurality of switches; battery charging and monitoring capability, and a fire alarm input.

The programmable controller has programmed decision capability that includes alarms and events reporting via dry contacts, an onboard audible alarm, and auto emails; a second algorithm having three stages of lead acid battery charging levels to maximize battery life including a low battery disconnect capability, battery mismatch detection and reporting, real-time battery condition diagnostic capability and safety net battery disconnect, and automatic recovery from reverse polarity situations for inputs.

The LCD display displays graphic information such as voltages, current per channel, temperature, battery charge and health status, and user programmed information in symbols and in text. In the exemplary embodiment, the LCD is a 2.7 inch graphical multicolor display for display only. In alternate embodiments, the LCD display can have interactive touch input. The main LCD display connector accommodates a touchless or a touch LCD display. A diagnostic LCD connector is also available for powering an additional display for visual enhancement in laboratory or field setup environments.

The smart uninterruptible power supply has a preprogrammed first algorithm that will perform load shedding by gradually shutting down outputs to maximize system operation while on DC/battery power working together in functional combination with the second algorithm in the event of input power loss/lack of adequate power. The outputs that are shut down are individually activated by a combination of user-programmed selection, load current amount, and elapsed time. The shutdown occurs for selectable reasons such as: immediately after a main power loss, within a predetermined time period after main power loss, or when the discharged battery reached a certain threshold level; all of which are adjustable when programming the system via the onboard programmable controller through an app or web based interface.

The method of use of the smart uninterruptible power supply includes installing the smart uninterruptible power supply, connecting inputs and output peripherals, applying power to the smart uninterruptible power supply, programming the smart uninterruptible power supply via a software interface, setting the manual selections via DIP switch, and monitoring and control of the smart uninterruptible power supply. Applications for the power door lock assembly include electronic door control and vehicle solenoid control among many other loads that accept 12V or 24V.

The features of the invention which are believed to be novel are particularly pointed out in the specification. The present invention now will be described more fully hereinafter with reference to the accompanying drawings, which are intended to be read in conjunction with both this summary, the detailed description and any preferred and/or particular embodiments specifically discussed or otherwise disclosed. This invention may, however, be embodied in many different forms and should not be construed as limited to the embodiments set forth herein; rather, these embodiments are provided by way of illustration only and so that this disclosure will be thorough, complete and will fully convey the full scope of the invention to those skilled in the art.

The figures which accompany the written portion of this specification illustrate embodiments and method(s) of use for the present invention, power door lock assembly constructed and operative according to the teachings of the present invention.

BRIEF DESCRIPTION OF THE DRAWINGS

FIG. 4 is a perspective view of a smart uninterruptible power supply showing a web page programming screen according to an embodiment of the present invention.

FIG. 5 is a perspective view of the components of a smart uninterruptible power supply showing a software programming screen view of the application software (commonly known as an "App") according to an embodiment of the present invention.

DETAILED DESCRIPTION OF THE INVENTION

Figure 1:
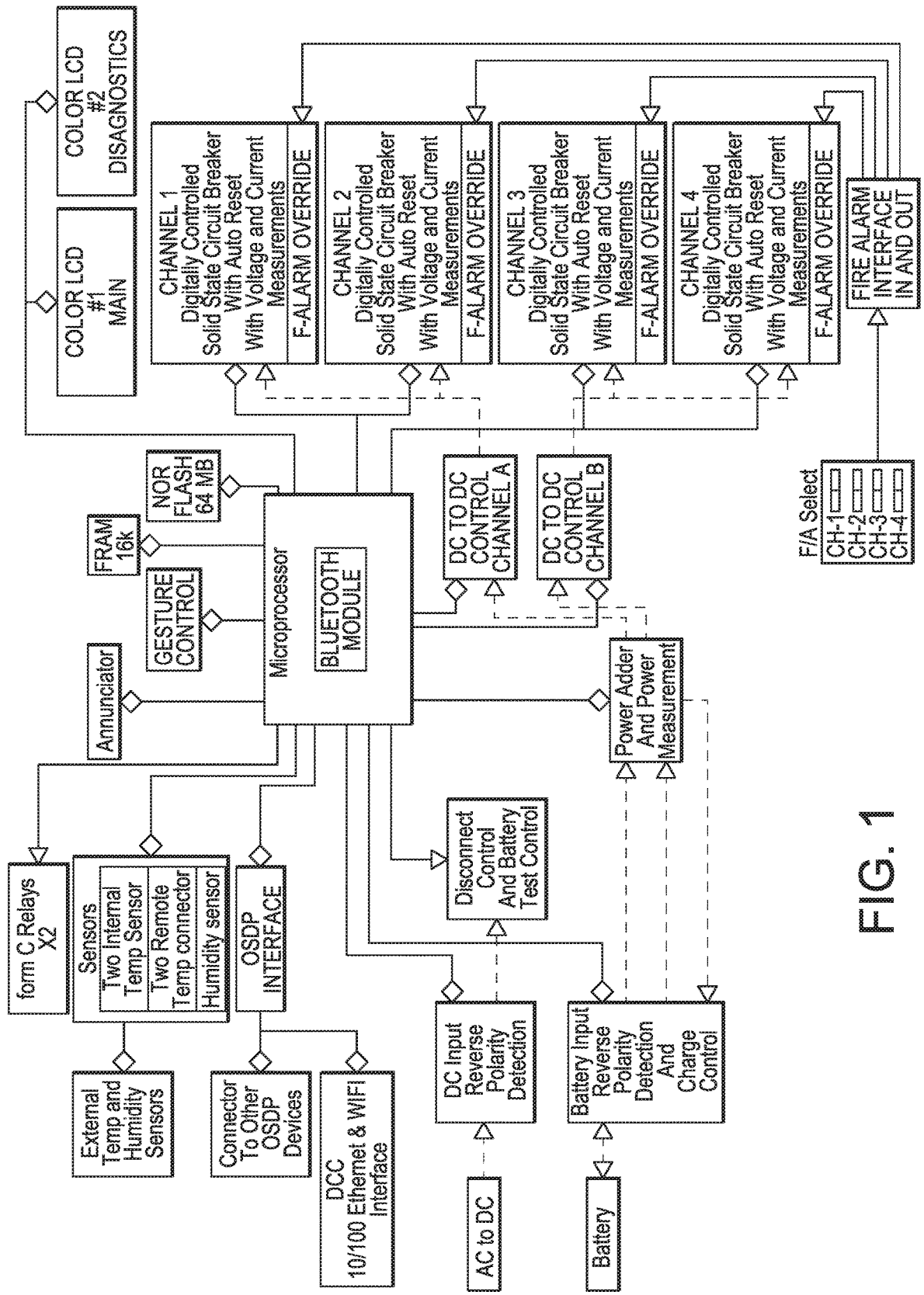
FIG. 1 is a schematic view of a smart uninterruptible power supply according to an embodiment of the present invention.

The various embodiments of the present invention will hereinafter be described in conjunction with the appended drawings, wherein like designations denote like elements.

The present invention is directed to a smart uninterruptible power supply.

In an exemplary embodiment of the present invention, a smart uninterruptible power supply includes a battery bidirectional power source input/battery charging output connector; specialized battery circuitry including battery input reverse polarity detection and reporting, charge control, and a power adder and measurement module; a voltage source power input; a DC input reverse polarity detection module; a disconnect control and battery test control module; a programmable controller having an onboard Bluetooth module including an antenna tuned for Bluetooth transmit/receive communications; a first algorithm having voltage output monitoring and control capability, output current monitoring capability, output power computational capability, shorted output detection and recovery capability, reverse polarity output detection and recovery capability, programmable load shedding capability and an LCD display communication capability; a second algorithm including battery charging and monitoring capability and battery testing, charge level detection, reverse polarity detection and recovery capability, and battery presence determination capability; a main LCD connector; a diagnostic LCD connector; an LCD display having displayed information including a first screen displaying information regarding power supply status and operating levels and information regarding status of peripherals, a second screen displaying relay status, a WLAN IP address, an Ethernet address, a gateway address and user programmable text and logos; a sensor for touchless gesture control to advance screens on the LCD display; temperature sensing capability; humidity sensing capability; four programmable/supervised input controls; an OSDP compliant RS-485 communication port; an Ethernet RJ-45 connector; four "wet" voltage outputs including two DC to DC output programmable regulator controllers, each having two output channels each having a digitally controlled solid-state circuit breaker including; load current monitoring and reporting capability; an onboard DIP switch including a plurality of switches; and a fire alarm input.

In the exemplary embodiment of the smart uninterruptible power supply, the power supply is remotely programmable via an encrypted TCP/IP wired connection and a password protected wireless Bluetooth and/or Ethernet connection wherein the programmable controller has a first algorithm that will gradually shut down outputs to maximize system operation. The outputs that are shut down are prioritized by user selection when programming the system via the onboard programmable controller. The programmable controller detects declining input battery voltage and then begins removing loads based on the amount of current the load is consuming. Load removal is an iterative process, in that the first algorithm enacts load shutdown based on elapsed time, input battery voltage, load current levels, and comparison to preprogrammed load prioritization.

The programmable controller has a preprogrammed second algorithm for measuring and determining battery health as well as charging the battery. The second algorithm also adjusts the charging voltage based on the battery voltage and discharge profile as compared to lookup charts based on proprietary data and manufacturer's data. The smart uninterruptible power supply is configured to monitor door lock load current over time, store the load current values, and via a first algorithm, analyze and signal an alert when detecting component aging and/or failure based on present and historic data.

In the exemplary embodiment of the smart uninterruptible power supply, the programmable controller includes alarms and events reporting via dry contacts, an onboard audio alert, and auto emails, and a second algorithm having three stages of lead acid battery charging levels, real-time battery and load diagnostic capability, battery mismatch detection and automatic recovery from reverse polarity situations for inputs and outputs. The programmable controller has one stage of battery charging dedicated to low battery disconnect, one stage of battery charging dedicated to battery reversal, and has one stage of battery charging dedicated to battery mismatch.

In the exemplary embodiment of the smart uninterruptible power supply, the LCD display presents information including input and output voltages, load current per output channel, temperature, humidity, battery charge and health status, and other operational information in addition to being user programmable in symbols and in text.

In the exemplary embodiment of the smart uninterruptible power supply, selection of the plurality of DIP switch positions is configured for violation of the fire alarm resulting in a red symbol on the LCD display, enabling a timer to show elapsed time since fire alarm violation as a command option to shutdown outputs, AND gating of both the fire alarm and DIP switch positioned in a manner to provide output power. The smart uninterruptible power supply is configured with a second algorithm to indicate battery charge status and control charging voltage based on a proprietary database, a first algorithm to record load data including output voltage and load current levels over time, determine component aging and/or failure, and provide an alert notifying the user of potential load failure based on changes in the load data and battery type and capacity used.

The smart uninterruptible power supply is designed to survive and recover from reverse battery applications. The first and second outputs of the smart uninterruptible power supply subservient to one regulator while having individual voltage and current measurement and providing individual overload or short circuit condition and the third and fourth outputs are subservient to a second regulator with each regulator having individual voltage and current measurement capability. The load voltage and current are fed back to the programmable controller, which in turn provides individual overload or short circuit load protection by opening the digitally controlled solid-state circuit breaker on the affected output resulting in the power being disconnected. The first algorithm routinely checks for system updates until the fault is removed at which time power is restored to the output. The smart uninterruptible power supply has two temperature and one humidity sensor onboard in addition to two onboard connectors for sensing temperature and humidity via a remote temperature and humidity sensor.

In the exemplary embodiment of the smart uninterruptible power supply, the programmable controller includes specialized software with a second algorithm that works together in functional combination with specialized battery charge control hardware circuitry to continuously monitor the battery's voltage and to adjust the charging voltage to a predetermined level. The algorithm adjusts the charging voltage above the battery's voltage as needed and determined by a proprietary charging formula. During the charging process, as the battery's voltage is increasing over time, the charging voltage is gradually increased as well to maintain a constant voltage or a constant-current charging schema. This form of microprocessor based "track charging" has two main benefits. First, when in the NORMAL charging mode and based on battery's manufacturer's instructions, the tracking charging voltage is set for optimum battery protection. This increases the battery's life expectancy, and prevents battery overheating or under charging. Secondly, via the use of Bluetooth or Web access, the user has also the option of either FAST or SLOW battery charging which is achieved by increasing or decreasing the charging-tracking voltage to a higher or a lower value than NORMAL. All battery charging and polarity parameters are constantly monitored and adjusted via the microprocessor. When the battery reaches its manufacturer's recommended capacity the microprocessor automatically decreases the tracking voltage all the way down to a trickle charge mode. For the user's benefit, the on board graphical display and the remote web monitor display battery's voltage, charging and capacity in real time.

The second algorithm is programmable via Bluetooth and/or web access. The algorithm determines the need for 24 volts DC at the battery input that can be supplied from one 24 volt DC or two 12 volt DC batteries in series. When configuring the power supply for an output voltage higher than 14 VDC second algorithm is then expecting a battery voltage of greater than 16 VDC. This typically requires two 12 volt DC batteries to be connected in series as a typical lead acid 12 volt battery voltage level is only 13.6 VDC. If the controller does not detect the proper battery voltage for the application, then, the controller algorithm will alert the user via activation of an onboard audio alert, activation of any of the programmable relays, by sending a remote SNMP or email messages, and by displaying the fault on the LCD display or via web on the user's remote web console. The controller will then work together in functional combination with the software containing the second algorithm to charge the mismatched single battery at a rate of 12V without damaging it, as would be the case by applying a misinterpreted level for a 24 volt DC battery input voltage setting, thus eliminating a historic condition in faulty charge settings. Reverse polarity on the battery or input will be detected by the first algorithm software and indications from the DC input reverse polarity detection module resulting in the power being disconnected when the programmable controller signals the disconnect control and battery test control module.

In the exemplary embodiment of the smart uninterruptible power supply, during input voltage power loss, and when power is being provided by the battery, the programmable controller uses its specialized charge control software and hardware circuitry together in functional combination to continuously monitor the discharging battery's voltage. When reaching a certain predetermined voltage threshold, (as previously determined by the user's mobile Bluetooth or web interface), the power supply automatically begins to shed loads by shutting down any of its four outputs, in order of priority, as previously programmed via the first algorithm. User defined, load shedding can also take place when the battery reaches a certain threshold. For example, load shedding can occur for a programmed condition to shut down output #3 when the discharging battery is determined to be at 19.5 VDC. Regardless, for battery protection, all loads are removed when the battery voltage lowers to a certain predetermined protection voltage level.

In the exemplary embodiment of the smart uninterruptible power supply the programmable controller software includes a specialized second algorithm and hardware circuitry working together in functional combination to perform periodic automatic battery capacity tests in order to determine the battery's health and its ability to supply the needed field load during power failure and to alert the user if the battery failed its test. Alerts take place by activation of onboard audible alarm, activation of any of the programmable relays, by sending a remote SNMP or email messages and by displaying the fault on the built in graphical display or via web, on the user's remote web console. The programmable controller in functional combination with the software containing the second algorithm invokes a battery condition test by first forcing current into the battery to verify its basic capacity, then, gradually forcing the battery to assume the full field load while constantly monitoring various battery discharge parameters over time. At any time during the short period test, should the battery fail one of the monitored parameters, then, the built-in software containing the second algorithm in functional combination with the specialized battery monitoring hardware safeguard mechanism terminates the test and alerts the user via activation of the onboard audible alarm, activation of any of the programmable relays, by sending a remote SNMP or email messages and by displaying the fault on the built in graphical display or via web, on the user's remote web console.

The battery test takes place during a period when the input voltage is present on the input voltage terminals. During battery test, the controller sets a 'safety net' voltage mechanism to assure that a battery condition test failure will not result in a total system failure. When battery failure is detected, operation is recovered by switching out the battery input voltage to the input voltage and applying full input voltage to the field load automatically through the software and disconnect control and battery test control module thus avoiding manual one-click selection that would require a human presence. The battery that fails the test is now flagged as bad, and no further testing takes place until the controller detects that the battery is removed and replaced. The second algorithm assures that operation fully resumes on power from the input voltage terminals only until the bad battery is removed and replaced. The second algorithm controls battery testing, input load switching, computational actions such as calculating input power, decisions based on test results, bad battery replacement verification, and resumption of input power from the battery.

Referring now to the drawings, there is shown in FIG. 1 a view of the smart uninterruptible power supply schematic according to an embodiment of the present invention. The smart uninterruptible power supply contains two voltage regulators (DC to DC controllers Channel A and Channel B)

that each power two "wet" DC programmable outputs each having a digitally controlled and measured solid-state circuit breaker. DC to DC controller A provides a programmable output voltage of the same value to Channel 1 and Channel 2. DC to DC controller B provides a programmable output voltage of the same value to Channel 3 and Channel 4. Output current is limited by a combination of the programmable controller that activates the digitally controlled solid-state circuit breakers. When the output draws excessive current beyond a preprogrammed level, the programmable, digitally controlled solid-state circuit breakers open the output connection so that it no longer receives current. The programmable controller tests for the overcurrent condition via the first algorithm at a rate of more than 100 Hz which is more than 100 times per second. The connection remains open until the excessive current is no longer present. The digitally controlled solid-state circuit breakers offer the advantage of surviving excessive current and can be reset an infinite amount of times, offering an advantage over fuses and without experiencing contact damage thus offering an advantage over relays. The 1 . . . N "wet" outputs have individually controlled current limits that are programmable via mobile application software or Ethernet/website software. The digitally controller solid state circuit breakers are also capable of measuring current and sending measure values back to the programmable microprocessor controller.

The smart uninterruptible power supply also has a microprocessor based battery charger and capacity monitor, battery input reverse polarity detection, charge control, and a power adder and measurement module working together in functional combination as a means for measuring voltage, current, and polarity and signaling the programmable microprocessor controller as well as performing input source switching and disconnect, and battery charging functions as signaled by the programmable microprocessor controller. The LCD display is a multi-colored 2.7 inch compact indicator for providing information while reducing the product footprint areas. An additional color LCD #2 diagnostics connector is available as a larger screen connection. The programmable microprocessor controller monitors and controls the multi-page LCD display that is controlled by hand gestures that activate the gesture control resulting in the programmable microprocessor controller scrolling to the next screen on the LCD display. Screen information combined with intelligent parameter display frees the operator and/or installer from having to take hand measurements and make hand calculations.

Referring further to FIG. 1, the smart uninterruptible power supply features a OSDP RS-485 communication port, supervised inputs, event based programmable relays, internal and external temperature and humidity sensors, a Bluetooth transceiver embedded in the programmable microprocessor controller, and connection to web enabled controller working together in functional combination as a means for powering electronic controllers and electronic door locks in addition to various other loads, such as alarms, relays, lights, cameras, motion detectors, temperature detectors, gate controllers, and PLC controllers. The programmable microprocessor controller provides the DC to DC controllers with a voltage regulation level value for setting the regulated voltage level of the "wet" outputs.

Figure 2:
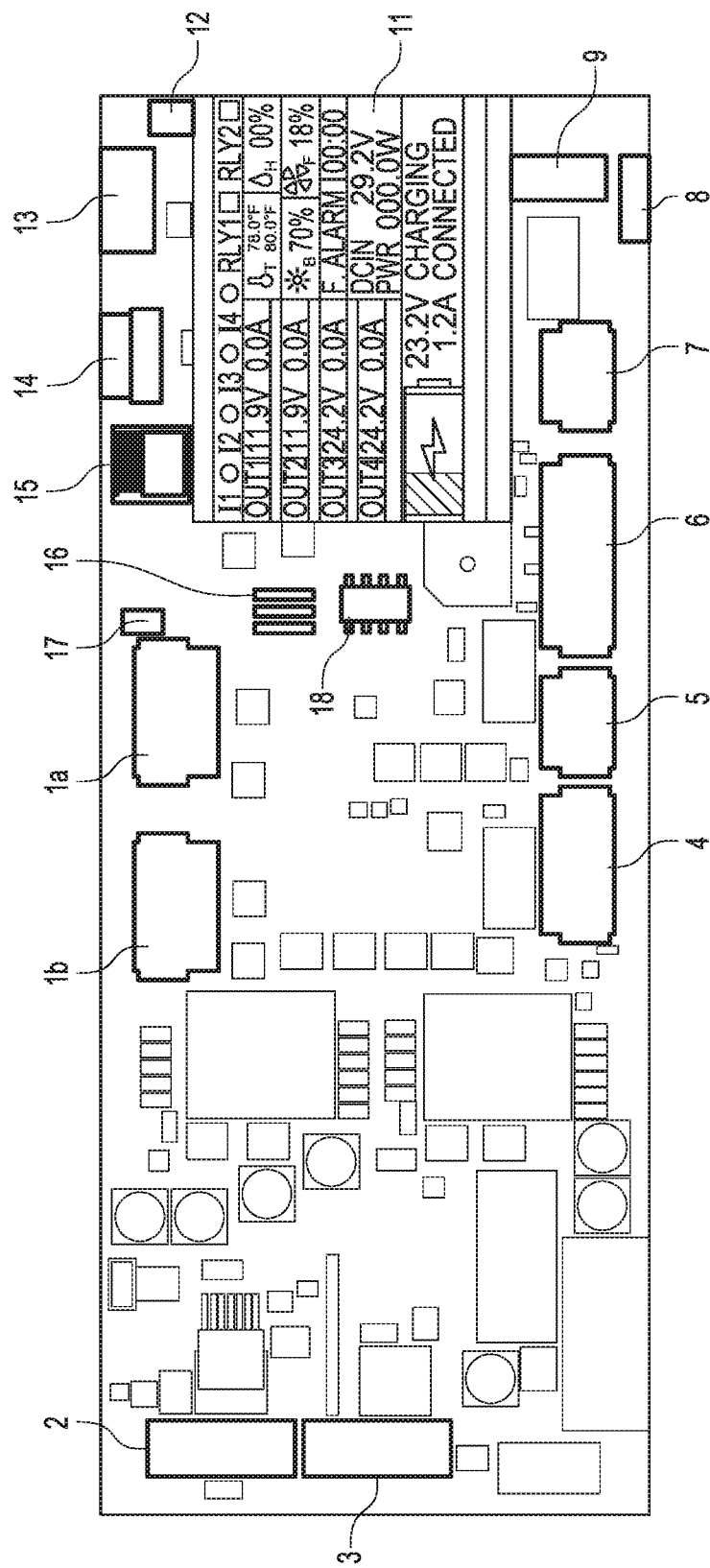
FIG. 2 is a perspective view of a smart uninterruptible power supply showing the power supply circuit board according to an embodiment of the present invention.

Referring now to FIG. 2 is a perspective view of a smart uninterruptible power supply showing the power supply according to an embodiment of the present invention. The smart uninterruptible power supply has four "wet" outputs including outputs 1 and 2 (1*a*), outputs 3 and 4 (1*b*). The smart uninterruptible power supply accepts input power via the voltage source power input (2) and a battery bidirectional power source input/battery charging output connector (3). The battery bidirectional power source input/battery charging output connector (3) is also a means for charging the battery(s). Additional inputs include dry contacts form C for two relays with programmable functionality (4), an OSDP compliant, RS-485 communication port (5) for programming and communication of values, four programmable/supervised input controls (6), a fire alarm IN/OUT connector (7) for intelligent fail safe and fail secure reaction to an active fire alarm, an optional data and communication web communication module (8) for future use, an onboard DIP switch including a plurality of switches that acts as a combination fire alarm outputs selector and SPS as stand-alone/web selector (9), the LCD display (11) for onsite diagnostics, a diagnostic LCD connector (12), a USB charging port (13) that provides 5 volts at 1 amp, a connector dedicated to factory use (14), a programmable microprocessor controller having an onboard Bluetooth module including an antenna tuned for Bluetooth transmit/receive communications (15), and an optional connector for two external temperature probes (17). AND gating of both the fire alarm circuitry and DIP switch (9), when position selected in a "non-CPU dependent manner," provides or removes output power from any selected output voltage connector, i.e., outputs 1 and 2 (1*a*) or outputs 3 and 4 (1*b*).

Figure 3:
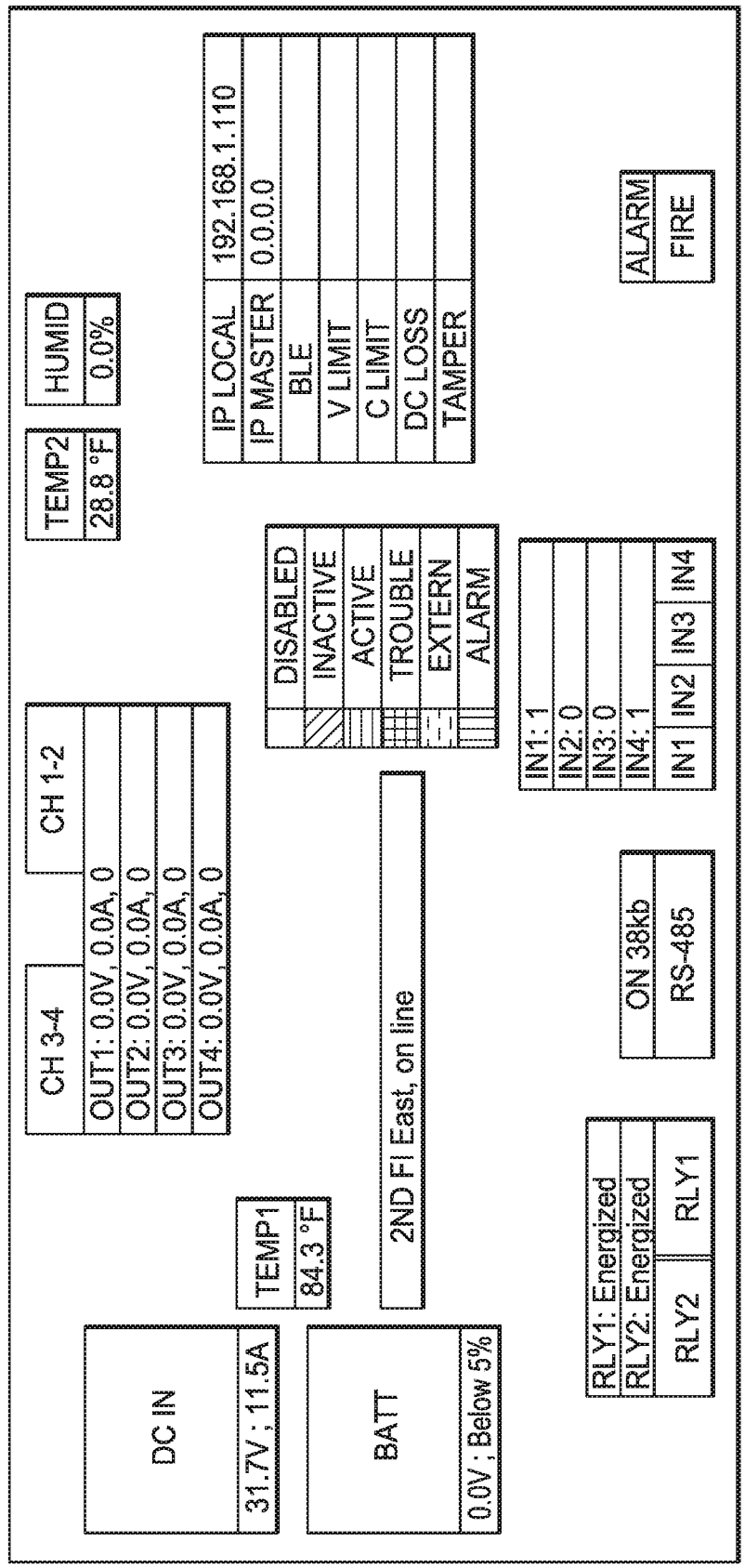
FIG. 3 is a perspective view of a smart uninterruptible power supply showing a quick reference system software screen view according to an embodiment of the present invention.

FIG. 3 is a perspective view of a smart uninterruptible power supply showing a quick reference system screen view according to an embodiment of the present invention. This screen view is a means by which to quickly obtain system status via a remote display with access to a web interface or the Application software. Information may include, yet is not limited to, DC input status; battery status; output status for each of the four "wet" outputs, including voltage levels and load current levels; board temperature and humidity; the location of the smart uninterruptible power supply in user programmed text; IP addresses; programmed system settings including BLE, V LIMIT, C LIMIT, DC LOSS, and TAMPER; relay status; programmable input status; alarm status; and RS-485 connection status.

Figure 4:
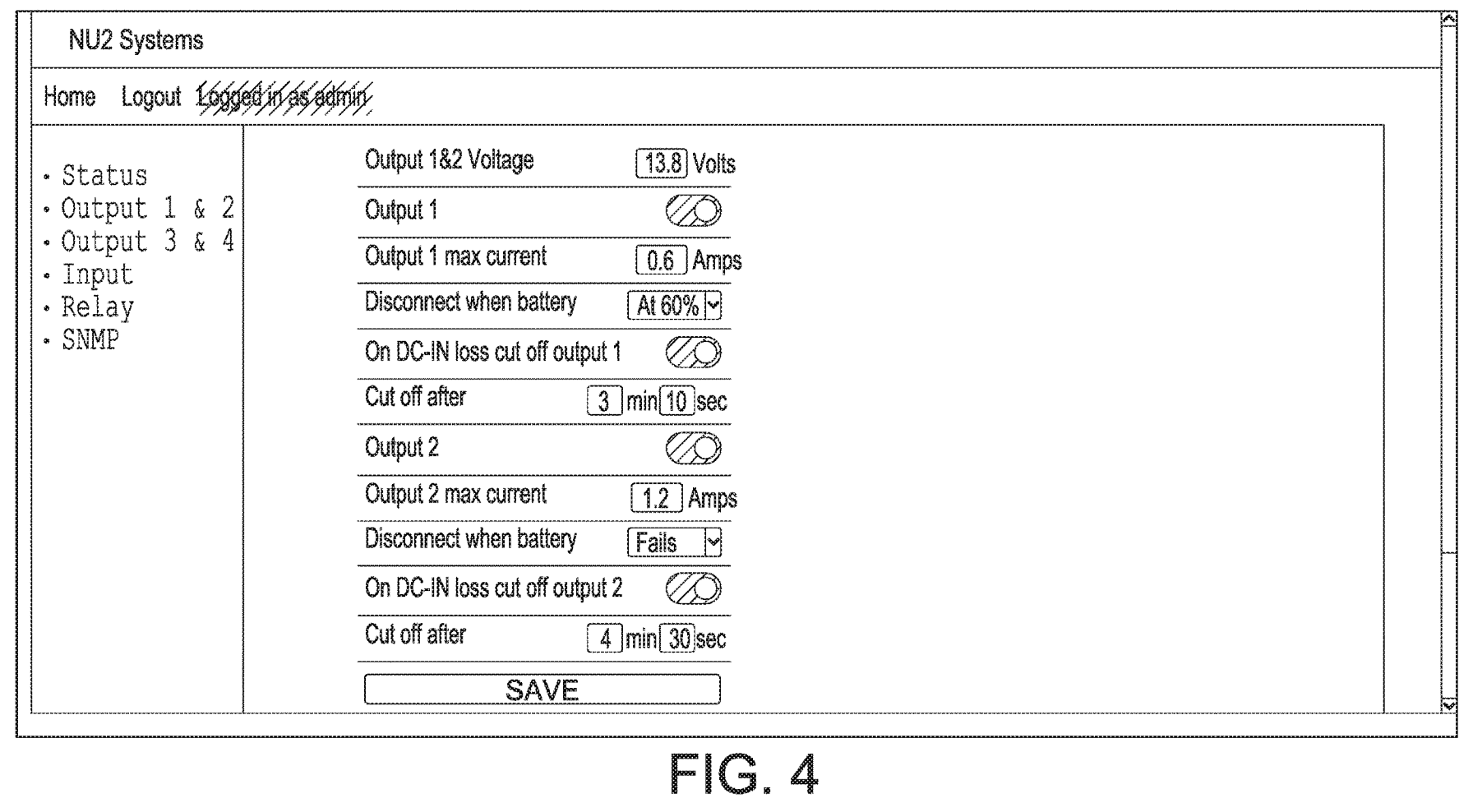

FIG. 4 is a perspective view of a smart uninterruptible power supply showing a web page programming screen according to an embodiment of the present invention. This screen view shows the versatility of the programmable first algorithm in relation to controlling current levels over applied for timed intervals. The display screen also shows the load shedding decision capability of the first algorithm that works together in functional combination with the second algorithm for prolonging and optimizing operation based on available battery charge levels.

FIG. 5 is a perspective view of the components of a smart uninterruptible power supply showing a software programming screen view of the application software (commonly known as an "App") according to an embodiment of the present invention. Referring now to FIG. 5. of a screen view showing the programmable versatility of the first algorithm load shedding priorities based on load current levels, elapsed time, and user defined load prioritization.

Figure 6B:
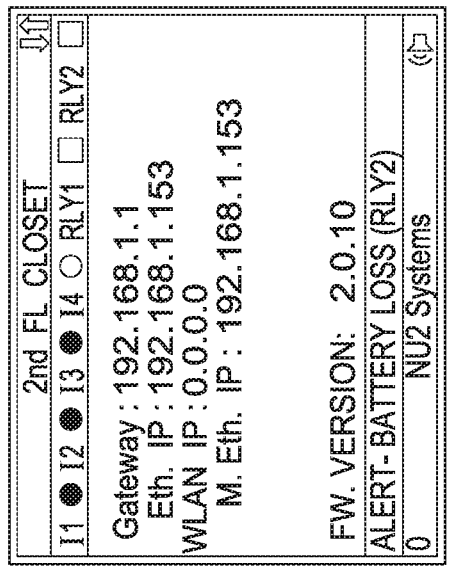
FIG. 6b is a perspective view of a smart uninterruptible power supply showing a second screen image on the LCD display according to an embodiment of the present invention.
Figure 6A:
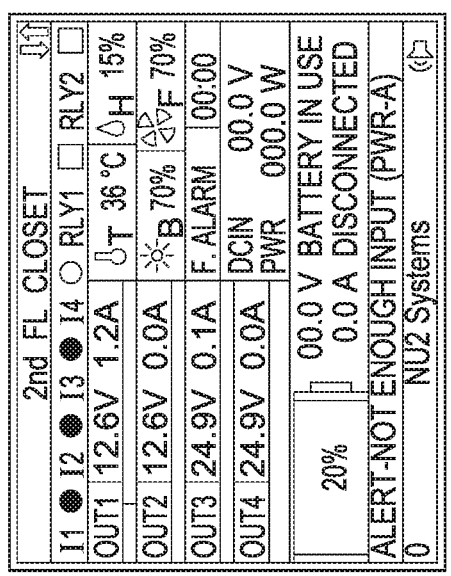
FIG. 6a is a perspective view of a smart uninterruptible power supply showing a first screen image on the LCD display according to an embodiment of the present invention.

FIG. 6*a* is a perspective view of a smart uninterruptible power supply showing a first screen image on the LCD display, according to an embodiment of the present invention. The LCD screen displayed items in this example includes a header name displayed in the top header line. This header name is user programmable and can be used to help the user identify the device's location such as "2nd FL—East Closet" and for discovering the device through a mobile BLE server (iPhone/Android/Web application). The header name can be configured through these devices. In the preferred embodiment the length of the header name is limited to 20 characters. The footer name located at the bottom of the is programmable footer and can contain anything the user wishes to display such as installing company's name, service phone number etc. in text, numbers, and symbols such as an alarm indication or company logo. The footer also displays the controller's address on the RS-485 chain. The input status below the header line, shows status of all four supervised inputs (I1, I2, I3, and I4). There are four round dots, one for each input's status. The dot color is blue when inputs are inactive and green when input is active. These dots offer a critical advantage to the user by displaying valuable input control information. For example, a "panic button" input can be used as a method for quickly adjusting and of the input controls in the event of a situation such as an active shooter. Based on this scenario, a user may wish to program doors for certain access conditions in the event of a "panic button" toggle to the on position. By displaying the information directly on the screen where the smart uninterruptible power supply is located, valuable time is saved as the display acts as an immediate notification to the user thereby avoiding the additional steps of having to pull the information up on a web page or phone/tablet application screen.

The output line shows the voltage level and the field's load current per channel for output current indicator 1 (OUT 1), output current indicator 2 (OUT 2), output current indicator 3 (OUT 3), and output current indicator 4 (OUT 4). This provides highly important information to the user at a glance without the need for manual meter measurements and calculations.

There are four current graphs, one associated with and located below the text for each output channel, displayed as four distinct control lines to show each output's state. As current increases/decreases, the current bar increases/decreases and the graph's color is changed based on alert current conditions as set by iOS/Android/Web software during the programming phase. The graph color is gray and voltage/current is displayed as 0.0 V and 0.0 A when a channel is disabled (via Bluetooth/Web device or any alert condition). If the current is 0-50% of alert current, then graph color is green. If the current is 51-75% of an alert current setting, then the graph color is yellow. If the current is 76-100% of alert current setting, then graph color is red.

The battery indicator is enabled when battery is connected to the battery bidirectional power source input/battery charging output connector. The indicator shows the battery's health in a numerical percentage and in a graphical manner in a display background. The graph color is normally green unless the battery voltage is below 80% then the graph's color changes from yellow through red to black in sequential fashion as the battery discharges. Battery labels include: CHARGING CONNECTED, BATTERY IN USE, DISCONNECTED, BATTERY CHARGING, BATTERY HEALTH in % and remaining time in HH:MM before Low Battery Disconnect (LBD) is activated.

The input power supply block shows the DC input voltage numerical value in volts and total delivered power numerical value in watts. DC input voltage label (DCIN), an input voltage value followed by the letter "V" for volts, an input power label (PWR), and an input power consumption value followed by the letter "W" for watts. The board temperature value is displayed adjacent to a temperature symbol next to the letter "T" for temperature along with the text "° F." for units of Fahrenheit or "° C." for units of Celsius. The smart uninterruptible power supply has an additional temperature probe used for fan speed control. The enclosures/closet humidity is monitored and displayed in as a percentage next to a symbol labelled with the letter "H" for humidity.

The display's illumination's intensity can also be configured by Mobile/Web application. This is shown as a value in a percentage next to the illuminated light symbol and letter "B" for brightness. The LCD display intensity cannot be configured below 10% and above 100% and it is configured in 10% steps. The fire alarm status monitors and displays a building's fire alarm status color of green when normal and red when in alarm condition for the background behind the "F. ALARM" text. When the fire alarm is off then status color is gray. An elapsed time timer value shows the fire alarm fault duration in 999 h:59 m (hours:minutes) format. The fan speed section displays fan speed values in a percentage. The fan is OFF if total load current is below 0.45 A. Fan speed is controlled by a combination of temperature as determined by an onboard temperature sensor as well as measured current draw. Every 1 A increment/decrement of load current increases/decreases fan speed as a part of the intelligent control.

FIG. 6*b* is a perspective view of a smart uninterruptible power supply showing a second screen image on the LCD display, according to an embodiment of the present invention. The second screen is a means for displaying relay status, a WLAN IP address, an Ethernet address, a gateway address, and programmable text and logos. The combination of text and numbers below the header line shows status of all four supervised inputs (I1, I2, I3, and I4). There are four round dots, one for each input's status. The dot color is blue when inputs are inactive and green when input is active. These dots offer a critical advantage to the user by displaying valuable input control information. For example, a "panic button" input can be used as a method for quickly adjusting the controls in the event of a situation such as an active shooter. A user may wish to program doors for certain access conditions in the event of a "panic button" toggle to the on position. By displaying the information directly on the screen where the smart uninterruptible power supply is located, valuable time is saved as the display acts as an immediate notification by not having to take the additional steps to pull the information up on a web page or phone/tablet application screen.

A second text line is shown above the footer line on the second display screen. This combination of text/numbers/symbols sends valuable system information as determined by the programmable controller based on the various inputs from the specialized battery circuitry, DC input reverse polarity detection module, disconnect control and battery test control module, digitally controlled solid-state circuit breaker working together in functional combination. The smart uninterruptible power supply features automatic discovery of the device's IP address and other pertinent network information thus eliminating the need to use discovery software. Connection to the smart uninterruptible power supply and its related devices such as the UIB (Universal Interface Board) and MDC (Multiple Door Controller) is achieved by using a standard browser via an Ethernet connection.

Figure 7:
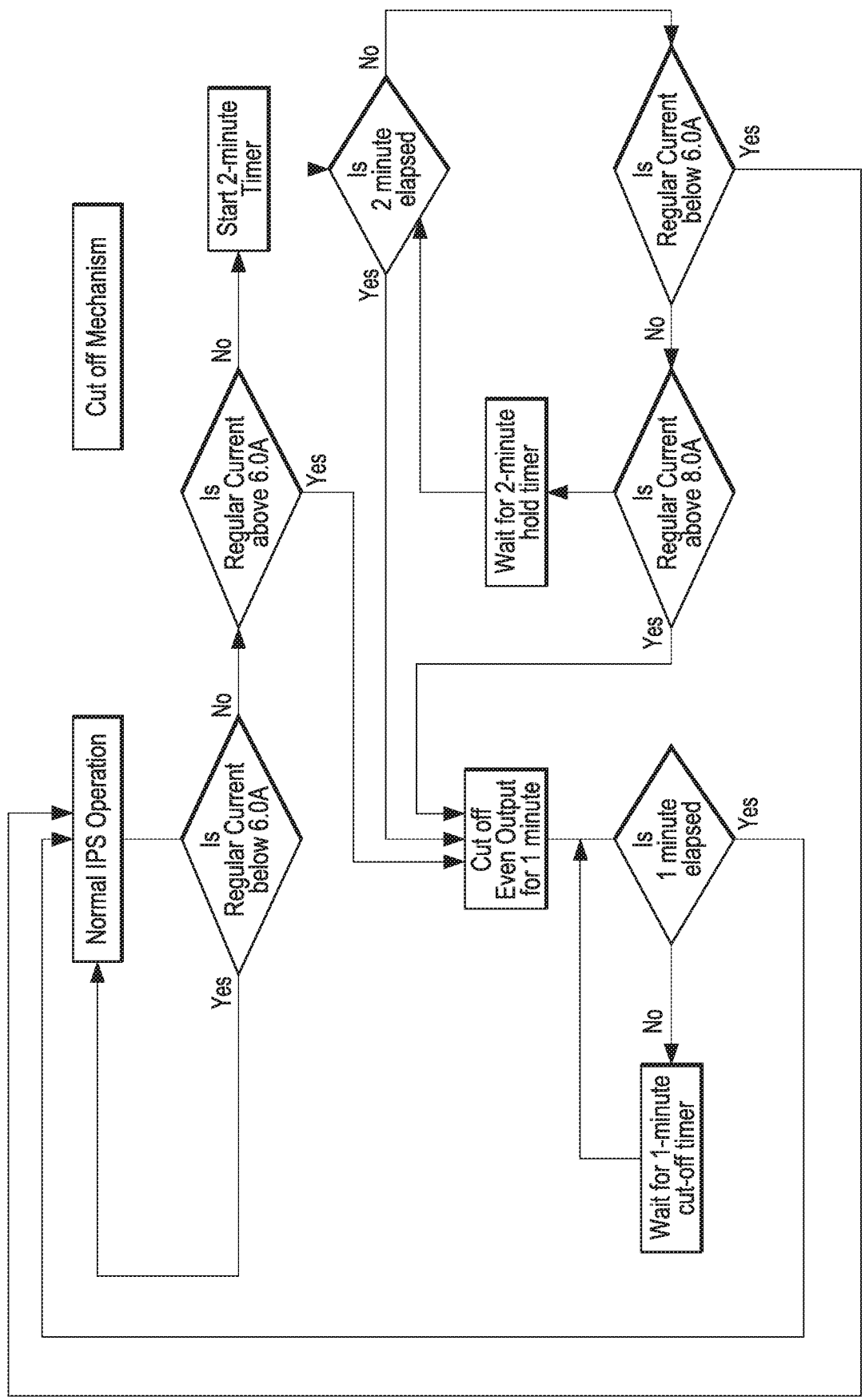
FIG. 7 is a flow chart illustrating a smart uninterruptible power supply method showing a load shedding flow chart portion of the first algorithm.

FIG. 7 is a flow chart of a smart uninterruptible power supply method showing a load shedding flow chart portion of the first algorithm. As stated, load shedding is a way to prolong operation via the first algorithm when input power is removed thus invoking the smart uninterruptible power supply to be powered by the battery via determinations made by the programmable microprocessor controller via the second algorithm. Load shedding takes into account a combination of user defined parameters such as load prioritization, load current levels, and elapsed time. The values shown in FIG. 7 are default values for purposes of logically explaining decision blocks in relation to sequential parameters such as elapsed time and load current. The default values are programmable in nature and not limited to those shown in the diagram. The "Cut off Mechanism" is an advantageous way for critical systems to remain active as long as possible while prolonging battery charge.

More specifically, load shedding provides the ability to 'turn off' some/all of the outputs, under certain conditions, and in a certain sequence and delay. This feature is in addition to a native "low battery disconnect" feature also provided by the smart uninterruptible power supply, where, when the battery is being discharged down to a certain voltage, the system automatically removes all loads off the battery in order to protect both field devices and the battery.

Typical access control systems include power consuming devices such as: (1) an access control controller/processor; (2) request to exit (REX) motion sensors, temperature sensors, wireless receivers and other sensors; (3) fail secure electrified locks; and (4) fail safe electrified locks. However, these typical power supplies have no ability to differentiate between the various power consumers, such that they can be treated differently at various conditions.

The load shedding feature of the inventive smart uninterruptible power supply provides the designer with an additional feature that can preserve standby battery's power for power consuming devices that the designer deems important, such as the access control's main processor/controller. Simply stated, during power failure, and when battery power is consumed, the load shedding feature can preserve the security system's core—its controller—for the longest possible time by 'shedding' power consuming devices that are not critical. For example, average request to exit (REX) motion detectors draws 80 ma. For a cluster compliment of 16 doors, that equals to roughly 1.25 A. The designer has the option then to shed REX current draw load immediately. The 'penalty' is "door forced open" alarms. However, this is a non-issue during power emergency, yet, stretching battery power functional time and preserving system's functionality is highly beneficial. In a similar manner, the load shedding feature can shed power consuming fail-safe electrified locks as they consume power 24×7.

Load shedding can be based on various parameters such as: (1) Immediate—as soon as AC power is lost, and battery is required to power the system; (2) Timed—a fixed amount of mm:ss after power is lost; (3) Voltage—when the battery is discharged to a certain pre-defined voltage threshold; (4) Other—based on a set of various and other conditions. These parameters can be set via the mobile app or remote web module.

Thus, for example, load shedding might be programmed as follows: (1) two minutes after AC power is lost, shut off power to request to exit (REX) motion sensors, temperature sensors, wireless receivers and other sensors; (2) twenty minutes after AC power is lost, shut off power to fail safe electrified locks; (3) when battery voltage reaches 23.0 V, shut off power to fail secure electrified locks; etc. Or, as another example, load shedding might be programmed as follows: (1) immediately after AC power is lost, shut off power to request to exit (REX) motion sensors, temperature sensors, wireless receivers and other sensors; (2) when battery voltage reaches 23.4 V, shut off power to fail safe electrified locks; (3) when batter voltage reaches 80% of nominal voltage, shut off power to fail secure electrified locks; etc. As will be recognized by those skilled in the art, numerous possibilities exist for load shedding strategies, which can be easily programmed into the inventive system.

The load shedding feature of the inventive smart uninterruptible power supply can also be integrated with a universal interface board (UIB), which is an intelligent controller with processor-controlled power management that can be used to power the security system's electrified locks and request to exit (REX) motion sensors, as well as others. Each UIB may be designed, for example, to handle a compliment of eight doors. A typical security system cluster may be made from two UIBs for a total of 16 doors. When combining the inventive smart uninterruptible power supply and UIB, the designer now has the option of load shedding devices with great granularity—down to the specific door's lock/device.

When the inventive smart uninterruptible power supply detects incoming power loss, and the use of the standby battery, the inventive smart uninterruptible power supply, via its OSDP compliant RS-485 communication port, can command individual UIB outputs/devices to be turned off and save battery power.

This significant feature then allows the designer much greater latitude by not requiring the designer to 'group' fail-safe or fail-secure devices into separate groups. With the use of the UIB, and for the purpose of load shedding, the designer can mix, both fail-safe and fail-secure locks onto the same UIB.

Load shedding at the UIB level can be done in one of several ways. A first option is at the user level, where the user has the option of marking lock output(s) port as fail-safe. Such port will remove power from the electrified lock when commanded to do so by the smart uninterruptible power supply. A second option is automatic, where the user can set a current draw threshold(s). During power loss, and when consuming battery power, all devices drawing current that is higher than the specified threshold will automatically be disabled. Multiple current threshold settings are allowed. As will be recognized by those skilled in the art, other options may also be provided.

Figure 8:
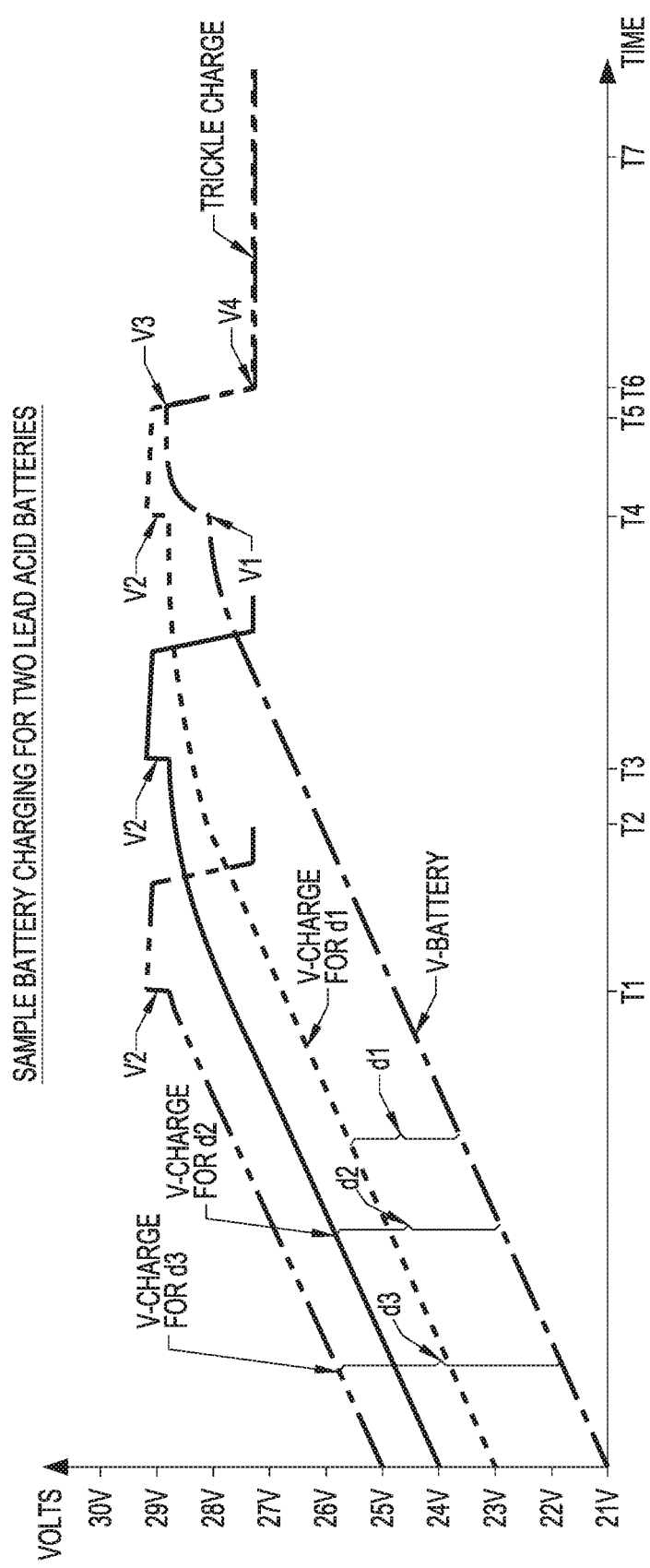
FIG. 8 is a graphical representation of a smart uninterruptible power supply method showing a battery charging algorithm employed thereby.

FIG. 8 is a graphical representation of a smart uninterruptible power supply method showing a battery charging algorithm employed thereby. In the specific example shown, two standard lead acid 12V batteries connected in series are being charged. However, one skilled in the art will immediately recognize that the shown method can be used with single batteries of other voltages and/or with other battery configurations.

The battery charging algorithm shown in FIG. 8 can employ various charge rates, including a normal charge rate (shown as V-CHARGE FOR d1), a fast charge rate (shown as V-CHARGE FOR d2) and/or an expedited charge rate (shown as V-CHARGE FOR d3). The charging mechanism for all three is similar, though the differential voltage applied (V-CHARGE FOR d1, V-CHARGE FOR d2, V-CHARGE FOR d3) varies.

As illustrated in FIG. 8, upon commencement of the charging cycle, the battery is analyzed for its actual voltage (V-BATTERY). The charging voltage is then determined for a constant current charge (V-CHARGE) based on the actual battery voltage and the charge rate (either selected by a user at that time or having been previously selected/specified by the user). As noted, each charge rate has a voltage differential associated with it (d1 for normal charge rate, d2 for fast charge rate, d3 for expedited charge rate). The specific values for the various voltage differentials is factory preset based on a formula that includes manufacturers' suggestions, battery type and capacity, temperature, and other variables.

Thus, the charging voltage (V-CHARGE) for the constant current charge portion of the cycle is based on actual voltage of the battery at the time (V-BATTERY) plus the charging differential (d1, d2, d3) for the selected charge rate, as shown.

Assuming now for the sake of simplicity that the normal charge rate has been selected. As shown, constant current charging takes place at a voltage (V-CHARGE FOR d1) of actual battery voltage (V-BATTERY) plus the charging differential (d1) until a predetermined time (T3) where the charging voltage (V-CHARGE FOR d1) is lowly lowered to bring the battery to a predetermined voltage (V1) at time (T4). At time (T4), charging voltage is increased to a higher voltage (V2) and then slowly lowered until battery voltage is brought to an increased voltage (V3) at time (T5). Charging voltage (V-CHARGE FOR d1) is then dropped to a lower voltage (V4) at time (T6), placing the battery into a trickle charge situation from time (T6) to time (T7) and beyond.

Fast and expedited charge rates follow the same format, except that fast charging employs voltage differential (d2) and the initial constant current charging period ends more quickly at time (T2), rather than at time (T3), and expedited charging employs voltage differential (d3) and the initial constant current charging period ends more quickly at time (T1), rather than at time (T3).

The exact specifications, information that is shown on the display, materials used, and method of use of the smart uninterruptible power supply may vary upon manufacturing.

The foregoing descriptions of specific embodiments of the present invention have been presented for purposes of illustration and description. They are not intended to be exhaustive or to limit the present invention to the precise forms disclosed, and obviously many modifications and variations are possible in light of the above teaching. The exemplary embodiment(s) were chosen and described in order to best explain the principles of the present invention and its practical application, to thereby enable others skilled in the art to best utilize the present invention and various embodiments with various modifications as are suited to the particular use contemplated.

What is claimed is:

1. A power supply employing a dynamic charging system and method for charging a battery, as well as employing a load shedding system and method for conserving battery life in the event of a power failure, comprising the following steps:
    analyzing the battery in real time to determine the actual voltage of the battery;
    determining a first charging voltage based at least in part on the actual battery voltage plus a first charge differential;
    charging the battery at the first charging voltage for a first period of time, wherein the first charging voltage is updated in real time as the actual voltage of the battery changes in real time, and wherein the first charge differential remains constant during the first period of time;
    after expiration of the first period of time, charging the battery at a second charging voltage for a second period of time, wherein the second charging voltage is based on the actual battery voltage plus a second charge differential, and wherein the second charge differential is reduced over time such that the second charging voltage approaches the actual voltage of the battery over time during the second period of time;
    after expiration of the second period of time, charging the battery at a third charging voltage for a third period of time, wherein the third charging voltage is greater than the second charging voltage at the time of expiration of the second period of time;
    after expiration of the third period of time, charging the battery at a fourth charging voltage for a fourth period of time, wherein the fourth charging voltage is less than the third charging voltage at the time of expiration of the third period of time, and wherein the fourth charging voltage remains constant for the fourth period of time;
    determining that a power failure has occurred and that the power supply is operating on power of a battery;
    determining that a first event has occurred, and in response thereto terminating battery power to a first subset of components;
    determining that a second event has occurred, and in response thereto, terminating battery power to a second subset of components, wherein the second event is different than the first event, such that battery power termination of the first subset of components and the second subset of components occur at different times;
    wherein at least one of the first event and the second event comprises one of the following: expiration of a threshold amount of time after occurrence of the power failure; the battery being discharged to a threshold voltage level; and the battery being discharged to a threshold percentage of full capacity; and
    wherein at least one of the first subset of components and the second subset of components comprises one of the following: sensors; fail secure electrified locks; and fail safe electrified locks.

2. The power supply of claim 1 wherein a plurality of charge rates are employed, the plurality of charge rates comprising a normal charge rate and a fast charge rate, the first charge differential of the fast charge rate being greater than the first charge differential of the normal charge rate, and the first period of time of the fast charge rate being shorter than the first period of time of the normal charge rate.

3. The power supply of claim 1 further comprising determining that a third event has occurred, and in response thereto, terminating battery power to a third subset of components, wherein the third event is different than the first event and the second event, such that battery power termination of the first subset of components, the second subset of components and the third subset of components occur at different times.

4. A power supply employing a dynamic charging system and method for charging a battery, comprising the following steps:
    analyzing the battery in real time to determine the actual voltage of the battery representing a state of charge of the battery;
    determining a first charging voltage based at least in part on the actual battery voltage plus a first charge differential;
    charging the battery at the first charging voltage for a first period of time, wherein the first charging voltage is updated in real time as the actual voltage of the battery changes in real time, and wherein the first charge differential remains constant during the first period of time;
    after expiration of the first period of time, charging the battery at a second charging voltage for a second period of time, wherein the second charging voltage is based on the actual battery voltage plus a second charge differential, and wherein the second charge differential is reduced over time such that the second charging voltage approaches the actual voltage of the battery over time during the second period of time;

after expiration of the second period of time, charging the battery at a third charging voltage for a third period of time, wherein the third charging voltage is greater than the second charging voltage at the time of expiration of the second period of time; and after expiration of the third period of time, charging the battery at a fourth charging voltage for a fourth period of time, wherein the fourth charging voltage is less than the third charging voltage at the time of expiration of the third period of time, and wherein the fourth charging voltage remains constant for the fourth period of time.

5. The power supply of claim 4 wherein a plurality of charge rates are employed, the plurality of charge rates comprising a normal charge rate and a fast charge rate, the first charge differential of the fast charge rate being greater than the first charge differential of the normal charge rate, and the first period of time of the fast charge rate being shorter than the first period of time of the normal charge rate.

6. The power supply of claim 5 wherein the plurality of charge rates further comprises an expedited charge rate, the first charge differential of the expedited charge rate being greater than the first charge differential of the fast charge rate, and the first period of time of the expedited charge rate being shorter than the first period of time of the fast charge rate.

7. The power supply of claim 6 wherein the charge rate employed for charging the battery is user selectable.

8. The power supply of claim 4 wherein the first charge differential is based at least in part on at least one of the following: manufacturers' suggestions, battery type and capacity, and temperature.

9. The power supply of claim 4 wherein the battery is charged at a constant current at least for the first period of time and the second period of time.

10. The power supply of claim 4 wherein the third charging voltage decreases over time during the third period of time.

11. The power supply of claim 4 wherein the fourth charging voltage is a trickle voltage and fourth period of time is indefinite.

12. The power supply of claim 4 wherein the analyzing step comprises determining if the battery has an incorrect polarity, if so, reports the incorrect polarity with an alarm.

13. The power supply of claim 12 wherein the events and the components are selectable by a user via a mobile app or remote web interface.

14. A power supply employing a load shedding system and method for conserving battery life in the event of a power failure, comprising the following steps:

determining that a power failure has occurred and that the power supply is operating on power of a battery;

determining that a first event has occurred, and in response thereto terminating battery power to a first subset of components;

determining that a second event has occurred, and in response thereto, terminating battery power to a second subset of components, wherein the second event is different than the first event, such that battery power termination of the first subset of components and the second subset of components occur at different times;

wherein at least one of the first event and the second event comprises one of the following: expiration of a threshold amount of time after occurrence of the power failure; the battery being discharged to a threshold voltage level; the battery being discharged to a threshold percentage of full capacity; and the battery reaching a given threshold voltage; and wherein at least one of the first subset of components and the second subset of components comprises one of the following: sensors; fail secure electrified locks; and fail safe electrified locks.

15. The power supply of claim 14 wherein the first subset of components comprises sensors and wherein the second subset of components comprises fail secure electrified locks.

16. The power supply of claim 14 further comprising determining that a third event has occurred, and in response thereto, terminating battery power to a third subset of components, wherein the third event is different than the first event and the second event, such that battery power termination of the first subset of components, the second subset of components and the third subset of components occur at different times.

17. The power supply of claim 16 wherein the third event comprises one of the following: expiration of a threshold amount of time after occurrence of the power failure; the battery being discharged to a threshold voltage level; and the battery being discharged to a threshold percentage of full capacity.

18. The power supply of claim 17 wherein the third subset of components comprises one of the following: sensors; fail secure electrified locks; and fail safe electrified locks.

19. The power supply of claim 18 wherein outputs of the power supply are grouped in pairs, each pair comprising two channels, wherein once a total current of both channels exceeds a threshold total current, an even channel for each pair is dropped, and wherein after a given time, the dropped channel it is brought back on line and checked for current in line with the threshold total current.

20. The power supply of claim 18 wherein each output of the power supply has a threshold maximum current, wherein once the threshold maximum current is exceeded an alarm is generated and if not resolved in a given time the output exceeding the threshold maximum current is disconnected for a given time.

21. The power supply of claim 16 wherein the first subset of components comprises sensors, wherein the second subset of components comprises fail secure electrified locks and wherein the third subset of components comprises fail safe electrified locks.

22. The power supply of claim 14 wherein the sensors comprise at least one of the following: request to exit motion sensors, temperature sensors, and wireless receivers.

23. The power supply of claim 14 wherein the power supply is in communication with a power management interface, and wherein at least one of the first subset of components and the second subset of components are defined as components controlled by the power management interface.

24. The power supply of claim 14 wherein a periodic battery load testing is performed, the periodic load testing comprising running actual system load on battery by lowering the input voltage below battery voltage, monitoring battery voltage under load and safeguarding against a failing battery by not allowing output from the battery to drop below a given voltage by terminating battery power to the components.

* * * * *